(12) United States Patent
Yang et al.

(10) Patent No.: US 12,156,376 B2
(45) Date of Patent: Nov. 26, 2024

(54) TWO-PHASE IMMERSION-TYPE HEAT DISSIPATION STRUCTURE HAVING POROUS STRUCTURE

(71) Applicant: AMULAIRE THERMAL TECHNOLOGY, INC., New Taipei (TW)

(72) Inventors: Ching-Ming Yang, New Taipei (TW); Chun-Te Wu, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 217 days.

(21) Appl. No.: 17/978,943

(22) Filed: Nov. 1, 2022

(65) Prior Publication Data

US 2024/0147662 A1 May 2, 2024

(51) Int. Cl.
*F28F 7/00* (2006.01)
*H05K 7/20* (2006.01)
(52) U.S. Cl.
CPC ........... *H05K 7/203* (2013.01); *H05K 7/2039* (2013.01)
(58) Field of Classification Search
CPC .............................. H05K 7/203; H05K 7/2036
USPC ........................................................ 165/80.4
See application file for complete search history.

(56) References Cited

U.S. PATENT DOCUMENTS

2021/0102294 A1* 4/2021 Miljkovic ........... C23C 14/5853
2022/0074680 A1   3/2022 Tung et al.
2022/0113093 A1   4/2022 Pichler et al.

FOREIGN PATENT DOCUMENTS

CN   110631301 A  * 12/2019
CN   114158232 A     3/2022
CN   114322618 A  *  4/2022

* cited by examiner

*Primary Examiner* — Davis D Hwu
(74) *Attorney, Agent, or Firm* — Li & Cai Intellectual Property Office

(57) ABSTRACT

A two-phase immersion-type heat dissipation structure having a porous structure is provided. The two-phase immersion-type heat dissipation structure includes a heat dissipation substrate, a plurality of fins, and a reinforcement frame. The heat dissipation substrate has a fin surface and a non-fin surface that face away from each other, the non-fin surface is configured to be in contact with a heat source immersed in a two-phase coolant, and the fins are integrally formed on the fin surface. A porous structure is covered onto at least one portion of the fin surface and at least one portion of the plurality of fins, and has a porosity of from 10% to 50% and a thickness that is from 0.1 mm to 1 mm. The reinforcement frame is bonded to the heat dissipation substrate and surrounds another one portion of the plurality of fins.

28 Claims, 11 Drawing Sheets

TWO-PHASE IMMERSION-TYPE HEAT DISSIPATION STRUCTURE HAVING POROUS STRUCTURE

FIELD OF THE DISCLOSURE

The present disclosure relates to a heat dissipation structure, and more particularly to a two-phase immersion-type heat dissipation structure having a porous structure.

BACKGROUND OF THE DISCLOSURE

An immersion cooling technology is to directly immerse heat producing elements (such as servers and disk arrays) into a coolant that is non-conductive, and heat generated from operation of the heat producing elements is removed through an endothermic gasification process of the coolant. Therefore, how to dissipate heat more effectively through the immersion cooling technology has long been an issue to be addressed in the industry.

SUMMARY OF THE DISCLOSURE

In response to the above-referenced technical inadequacy, the present disclosure provides a two-phase immersion-type heat dissipation structure having a porous structure.

In one aspect, the present disclosure provides a two-phase immersion-type heat dissipation structure. The two-phase immersion-type heat dissipation structure includes a heat dissipation substrate, a plurality of fins, and a reinforcement frame. The heat dissipation substrate has a fin surface and a non-fin surface that face away from each other, the non-fin surface is configured to be in contact with a heat source immersed in a two-phase coolant, and the plurality of fins are skived fins that are integrally formed on the fin surface by skiving. A porous structure is covered onto at least one portion of the fin surface and at least one portion of the plurality of fins, and the porous structure has a porosity of from 10% to 50% and a thickness that is from 0.1 mm to 1 mm. At least one of the fins has a thickness that is from 0.1 mm to 0.35 mm, a height that is from 5 mm to 10 mm, and at least two adjacent ones of the fins are spaced apart by a distance that is from 0.1 mm to 0.35 mm. The reinforcement frame is bonded to the heat dissipation substrate and surrounds another one portion of the plurality of fins.

In certain embodiments, the fins are made of copper or copper alloy.

In certain embodiments, the porous structure is made of copper, copper alloy, silver, or silver alloy.

In certain embodiments, the porous structure is formed by sintering a metal powder, and a D50 of the metal powder is from 10 μm to 30 μm.

In certain embodiments, the porous structure is formed by mixing a metal powder with a polymer material into a mixture and then sintering the mixture, and a D50 of the metal powder is from 10 μm to 30 μm.

In certain embodiments, the porous structure is formed by first blending a metal powder into a metal powder paste or a metal powder solution and then sintering the metal powder paste or the metal powder solution, and a D50 of the metal powder paste or the metal powder solution is from 1 μm to 10 μm.

In certain embodiments, the porous structure is formed by first blending a metal powder into a metal powder paste or a metal powder solution and then sintering the metal powder paste or the metal powder solution, and a D50 of the metal powder paste or the metal powder solution is from 0.01 μm to 0.5 μm.

In certain embodiments, the porous structure is a multi-layered compound structure formed by stacking of different materials.

In certain embodiments, the porous structure is a copper mesh structure.

In certain embodiments, an average thickness of portions of the porous structure that correspond in position to the heat source is greater than an average thickness of portions of the porous structure that do not correspond in position to the heat source.

In certain embodiments, an average thickness of portions of the porous structure that correspond in position to a center between any two adjacent ones of the fins is greater than an average thickness of portions of the porous structure that are connected to peripheries of the two adjacent ones of the fins.

In certain embodiments, the heat source includes a plurality of partial heat sources, and an average thickness of portions of the porous structure that correspond in position to the partial heat sources is greater than an average thickness of portions of the porous structure that do not correspond in position to the partial heat sources.

In certain embodiments, the porous structure is defined as a first porous structure that is covered onto the fin surface and second porous structures that are respectively covered onto peripheries of each of the fins, and the first porous structure is made of a material or by a production manner that is different from a material or production manner by which the second porous structures are made.

In certain embodiments, the heat dissipation substrate or the reinforcement frame has a plurality of through holes formed thereon, and a plurality of spring screws correspondingly pass through the plurality of through holes.

In certain embodiments, the two-phase immersion-type heat dissipation structure further includes a highly thermally conductive structure. The highly thermally conductive structure is bonded to the non-fin surface of the heat dissipation substrate, so that the heat dissipation substrate is in indirect contact with the heat source through the highly thermally conductive structure. The highly thermally conductive structure has an enclosed vacuum chamber formed therein, and the enclosed vacuum chamber contains liquid.

In another aspect, the present disclosure provides a two-phase immersion-type heat dissipation structure. The two-phase immersion-type heat dissipation structure includes a heat dissipation substrate, a plurality of fins, and a reinforcement frame. The heat dissipation substrate has a fin surface and a non-fin surface that face away from each other, the non-fin surface is configured to be in contact with a heat source immersed in a two-phase coolant, and the plurality of fins are pin-fins that are integrally formed on the fin surface. A porous structure is covered onto at least one portion of the fin surface and at least one portion of the plurality of fins, and the porous structure has a porosity of from 10% to 50% and a thickness that is from 0.1 mm to 1 mm. At least one of the fins has a diameter that is from 0.3 mm to 1 mm, a height that is from 3 mm to 7 mm, and at least two adjacent ones of the fins are spaced apart by a distance that is from 0.3 mm to 0.6 mm. The reinforcement frame is bonded to the heat dissipation substrate and surrounds another one portion of the plurality of fins.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
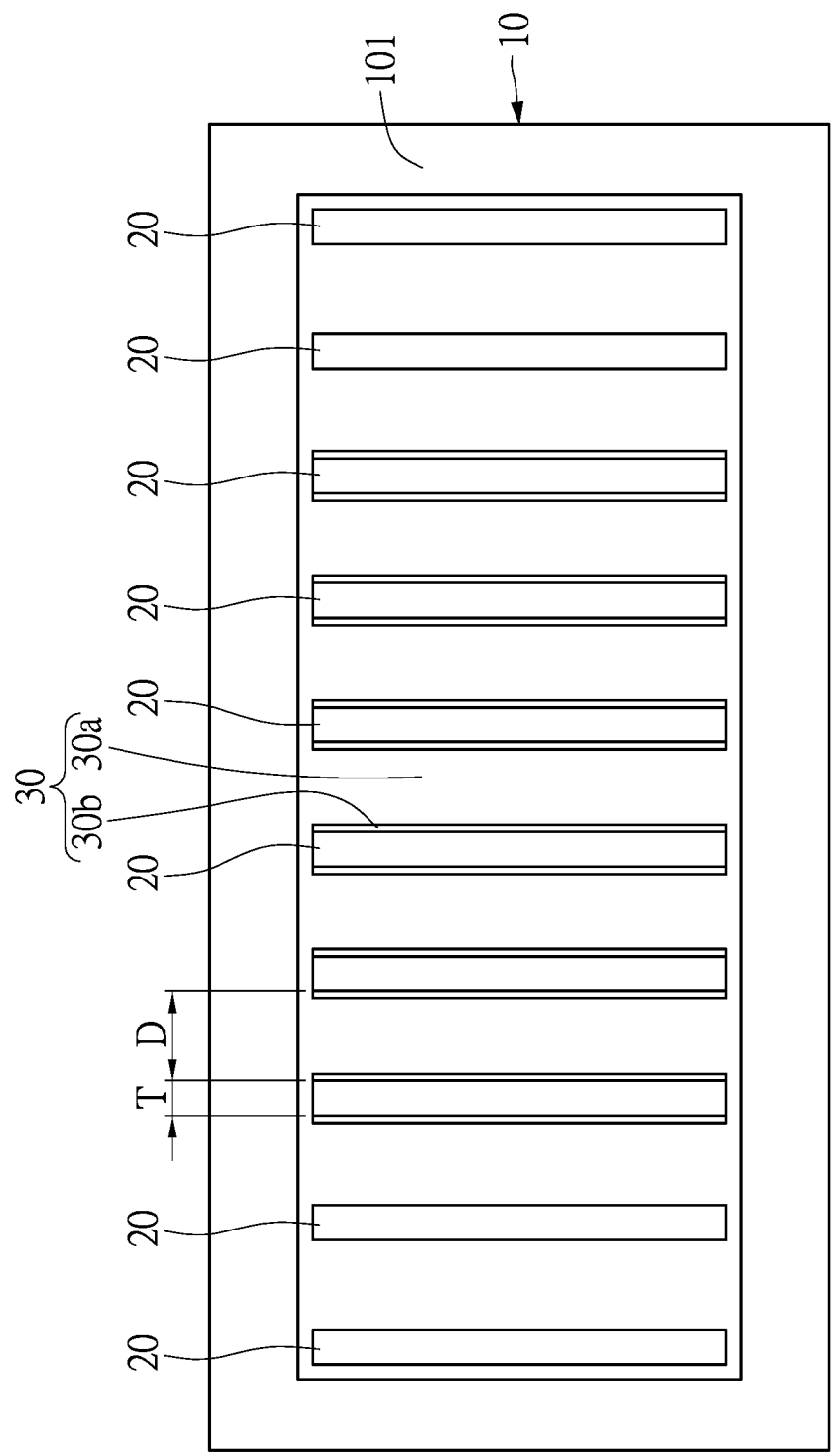
FIG. 1 is a schematic top view of a two-phase immersion-type heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
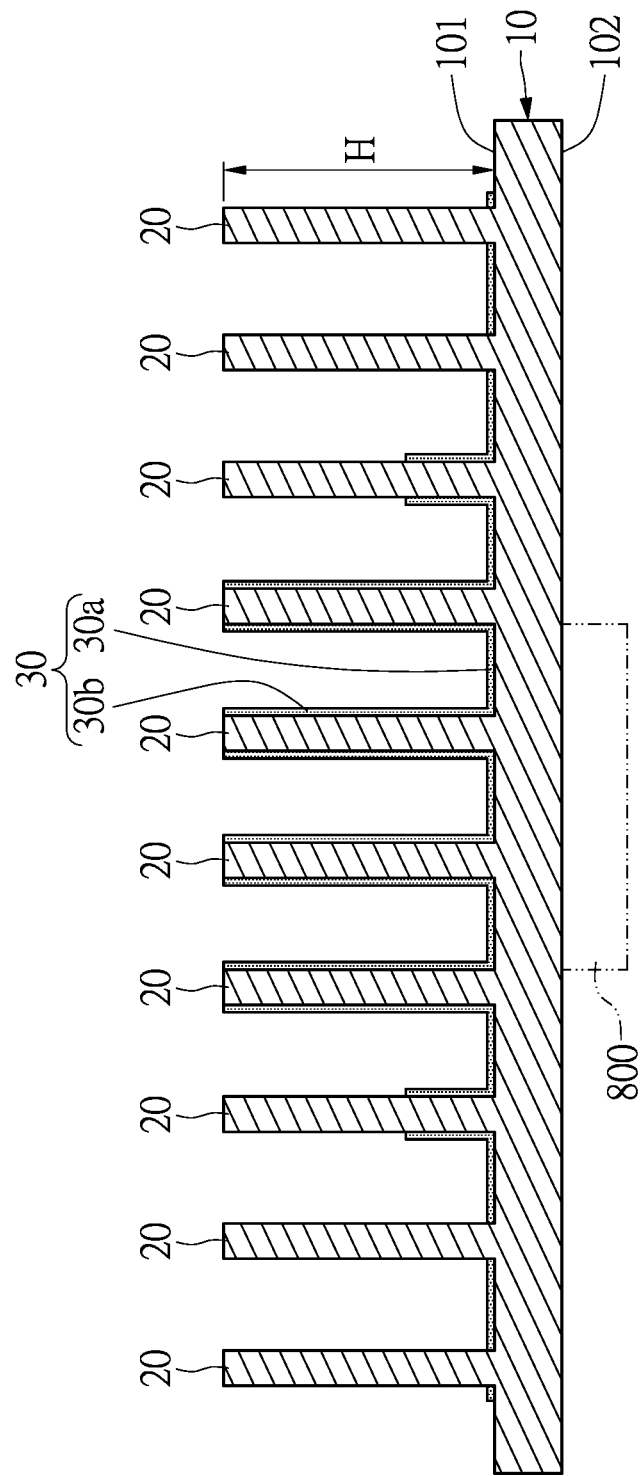
FIG. 2 is a schematic side view of the two-phase immersion-type heat dissipation structure according to the first embodiment of the present disclosure.

Referring to FIG. 1 to FIG. 2, a first embodiment of the present disclosure provides a two-phase immersion-type heat dissipation structure having a porous structure for contacting a heat source immersed in a two-phase coolant. As shown in FIG. 1 and FIG. 2, the two-phase immersion-type heat dissipation structure having a porous structure provided in the present disclosure includes a heat dissipation substrate 10 and a plurality of fins 20.

In this embodiment, the heat dissipation substrate 10 can be made of a material having high thermal conductivity, such as aluminum, copper, or copper alloy. The heat dissipation substrate 10 can be made of a non-porous heat dissipation material or a porous heat dissipation material. Preferably, the heat dissipation substrate 10 can be a porous heat dissipation plate immersed in a two-phase coolant (FLUORINERT™) and having a porosity of greater than 8% such that an amount of bubbles generated is increased, so as to improve an immersion-type heat dissipation effect.

In this embodiment, the heat dissipation substrate 10 has a fin surface 101 and a non-fin surface 102 that face away from each other. The non-fin surface 102 of the heat dissipation substrate 10 is configured to be in contact (e.g., in a direct contact, or in an indirect contact via an intermediate layer) with a heat source 800 immersed in a two-phase coolant. The fins 20 can be made of copper or copper alloy. Furthermore, the fins 20 are integrally formed on the fin surface 101 by skiving. That is, in this embodiment, skived fins that are arranged in very high density are formed on the fin surface 101 of the heat dissipation substrate 10 by skiving. Furthermore, at least one of the fins 20 has a thickness T that is from 0.1 mm to 0.35 mm, and the thickness T indicates a thickness at a center of a single fin 20. At least two adjacent ones of the fins 20 are spaced apart by a distance D that is from 0.1 mm to 0.35 mm, and the distance D indicates a normal distance from one side surface of one of the fins 20 to an opposite side surface of an adjacent one of the fins 20. The one of the fins 20 has a height H that is from 5 mm to 10 mm, and the height H indicates a perpendicular distance from the fin surface 101 to a highest point of the one of the fins 20.

Furthermore, in this embodiment, a porous structure 30 is covered onto at least one portion of the fin surface 101 of the heat dissipation substrate 10 and at least one portion of the plurality of fins 20, and the porous structure 30 has a porosity of from 10% to 50% and a thickness that is from 0.1 mm to 1 mm. Accordingly, a quantity of nucleating regions of air bubbles near the fin surface 101 and the fins 20 can be increased, and heat generated by the heat source 800 can be conducted to positions that are higher on the fins 20, so as to increase a usage of the positions that are higher on the fins 20.

In detail, the porous structure 30 can be made of copper, copper alloy, silver, or silver alloy. Furthermore, the porous structure 30 can be formed by sintering a metal powder, and the sintering mentioned herein may indicate a loose sintering. Furthermore, the porous structure 30 can be formed by mixing a metal powder with a polymer material into a mixture and then sintering the mixture, and the polymer material can be a binder or a pore-making agent. The porous structure 30 can also be formed by first blending a metal powder into a metal powder paste or a metal powder solution that can be used for coating, and then sintering the metal powder paste or the metal powder solution. A D50 of the metal powder is preferably from 10 μm to 30 μm, or from 30 μm to 500 μm. A D50 of the metal powder paste or the metal powder solution is preferably from 1 μm to 10 μm, or from 0.01 μm to 0.5 μm.

Furthermore, the porous structure 30 can be defined as a first porous structure 30a that is covered onto the fin surface 101 and second porous structures 30b that are respectively covered onto peripheries of each of the fins 20, and the first porous structure 30a can be made of a material or production manner that is different from a material or production manner by which the second porous structures 30b are made. Moreover, peripheries of one portion of the fins 20 that are located above the heat source 800 can be completely covered by the second porous structures 30b, and peripheries of another one portion of the fins 20 that are located away from the heat source 800 can be not covered by the second porous structures 30b.

Second Embodiment

Figure 3:
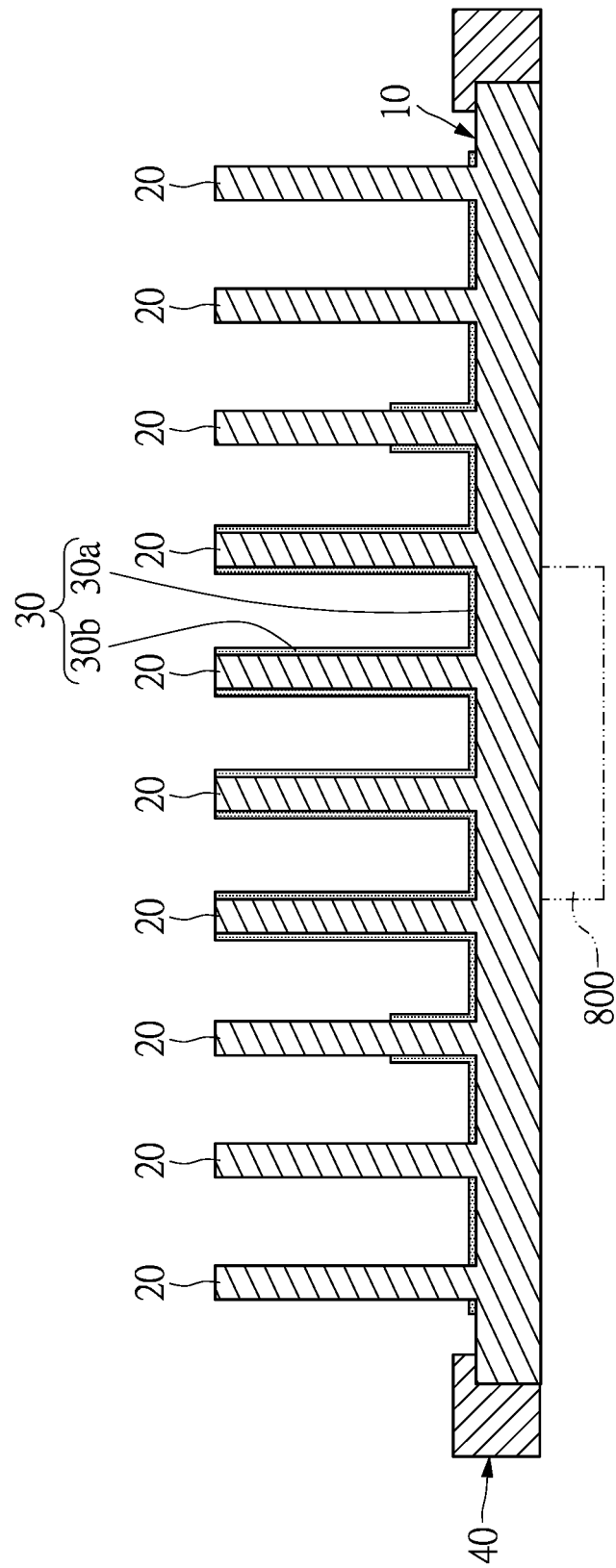
FIG. 3 is a schematic side view of a two-phase immersion-type heat dissipation structure according to a second embodiment of the present disclosure.

Referring to FIG. 3, a second embodiment of the present disclosure is substantially the same as the first embodiment, and the difference therebetween is described as follows.

In this embodiment, a reinforcement frame 40 is bonded to the heat dissipation substrate 10. The reinforcement frame 40 surrounds at least one portion of the plurality of fins 20 for enhancing an overall structural strength and avoiding issues and damage caused by warpage. The reinforcement frame 40 can be made of aluminum alloy or stainless steel. Furthermore, the reinforcement frame 40 can be bonded to the heat dissipation substrate 10 by press-fitting, soldering, friction stir welding, adhesion, or diffusion bonding.

Third Embodiment

Figure 4:
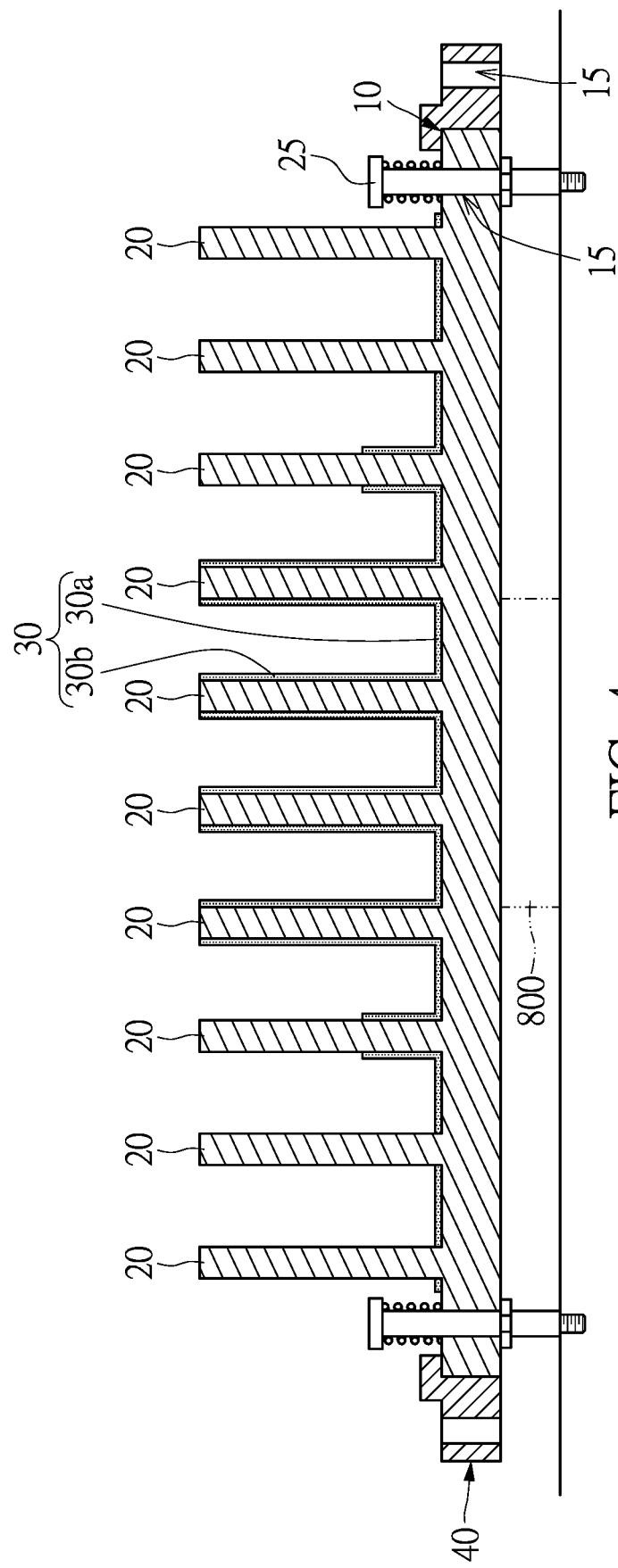
FIG. 4 is a schematic side view of a two-phase immersion-type heat dissipation structure according to a third embodiment of the present disclosure.

Referring to FIG. 4, a third embodiment of the present disclosure is substantially the same as the first embodiment and the second embodiment, and the difference therebetween is described as follows.

In this embodiment, two side surfaces of the heat dissipation substrate 10 or two side surfaces of the reinforcement frame 40 can have a plurality of through holes 15 formed thereon, and a plurality of spring screws 25 correspondingly pass through the plurality of through holes 15 for firmly fixing the heat dissipation substrate 10 to a main board having the heat source 800.

Fourth Embodiment

Figure 5:
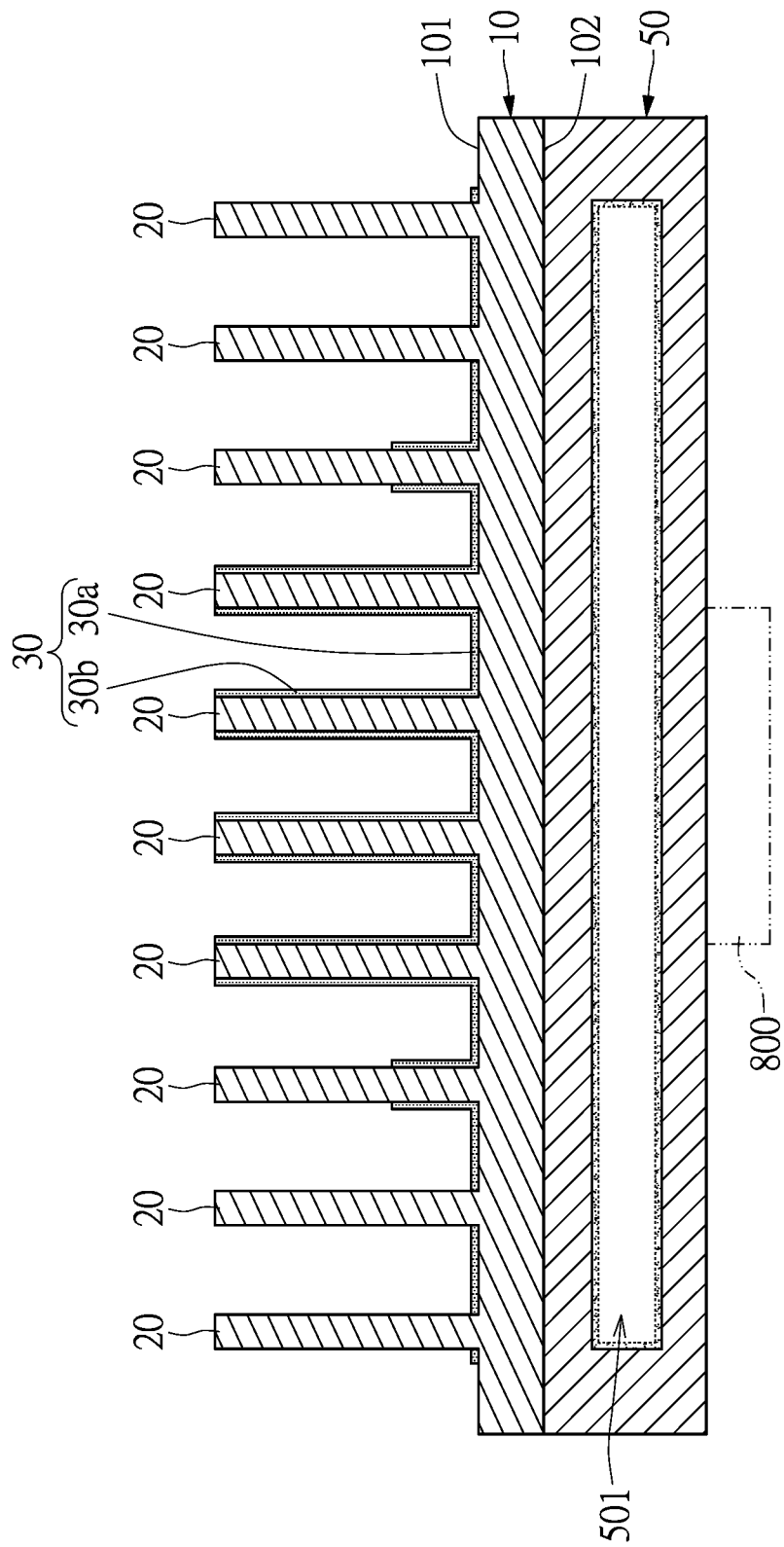
FIG. 5 is a schematic side view of a two-phase immersion-type heat dissipation structure according to a fourth embodiment of the present disclosure.

Referring to FIG. 5, a fourth embodiment of the present disclosure is substantially the same as the first embodiment, and the difference therebetween is described as follows.

A highly thermally conductive structure 50 is further included in the present disclosure. In addition, the highly thermally conductive structure 50 is bonded to the non-fin surface 102 of the heat dissipation substrate 10, so that the heat dissipation substrate 10 is in indirect contact with the heat source 800 that is immersed in the two-phase coolant through the highly thermally conductive structure 50. In detail, the highly thermally conductive structure 50 can be bonded to the non-fin surface 102 of the heat dissipation substrate 10 by soldering, friction stir welding, adhesion, or diffusion bonding. In other embodiments, the heat dissipation substrate 10 and the highly thermally conductive structure 50 can be integrally formed.

Furthermore, the highly thermally conductive structure 50 has an enclosed vacuum chamber 501 formed therein, sintering bodies can be formed on an upper chamber wall and a lower chamber wall of the enclosed vacuum chamber 501, and the enclosed vacuum chamber 501 contains adequate amounts of liquid, in which the liquid can be water or acetone. Moreover, a bottom surface of the highly thermally conductive structure 50 can be in contact with the heat source 800 that is immersed in the two-phase coolant. Accordingly, for the heat source 800 that is immersed in the two-phase coolant, heat generated thereby can be removed through an endothermic gasification process of the two-phase coolant. In addition, the highly thermally conductive structure 50 can be in contact with the heat source 800 and absorb the heat generated thereby. In this way, the liquid in the enclosed vacuum chamber 501 is gasified and evaporated into vapor. The vapor is dispersed to the heat dissipation substrate 10, and the heat is rapidly conducted to the plurality of skived fins that are very densely distributed and integrally formed on the heat dissipation substrate 10. The heat absorbed by the skived fins can then be removed through the endothermic gasification process of the two-phase coolant. After transmitting the heat, the vapor in the enclosed vacuum chamber 501 that is dispersed to the heat dissipation substrate 10 is condensed at the upper chamber wall and flows to the lower chamber wall. By performing this loop at a high speed, the heat generated by the heat source 800 can be rapidly transmitted outward, thereby improving an overall immersion-type heat dissipation effect.

Fifth Embodiment

Figure 6:
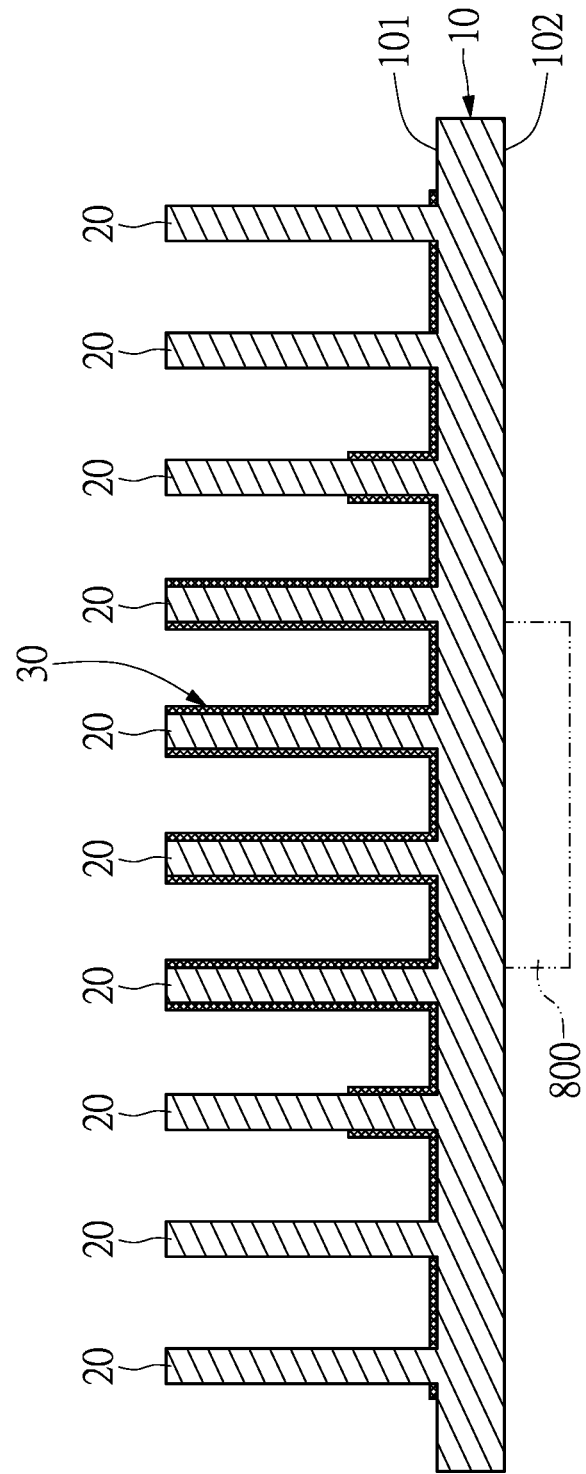
FIG. 6 is a schematic side view of a two-phase immersion-type heat dissipation structure according to a fifth embodiment of the present disclosure.

Referring to FIG. 6, a fifth embodiment of the present disclosure is substantially the same as the first embodiment, and the difference therebetween is described as follows.

In this embodiment, the porous structure 30 can be a copper mesh structure.

Sixth Embodiment

Figure 7:
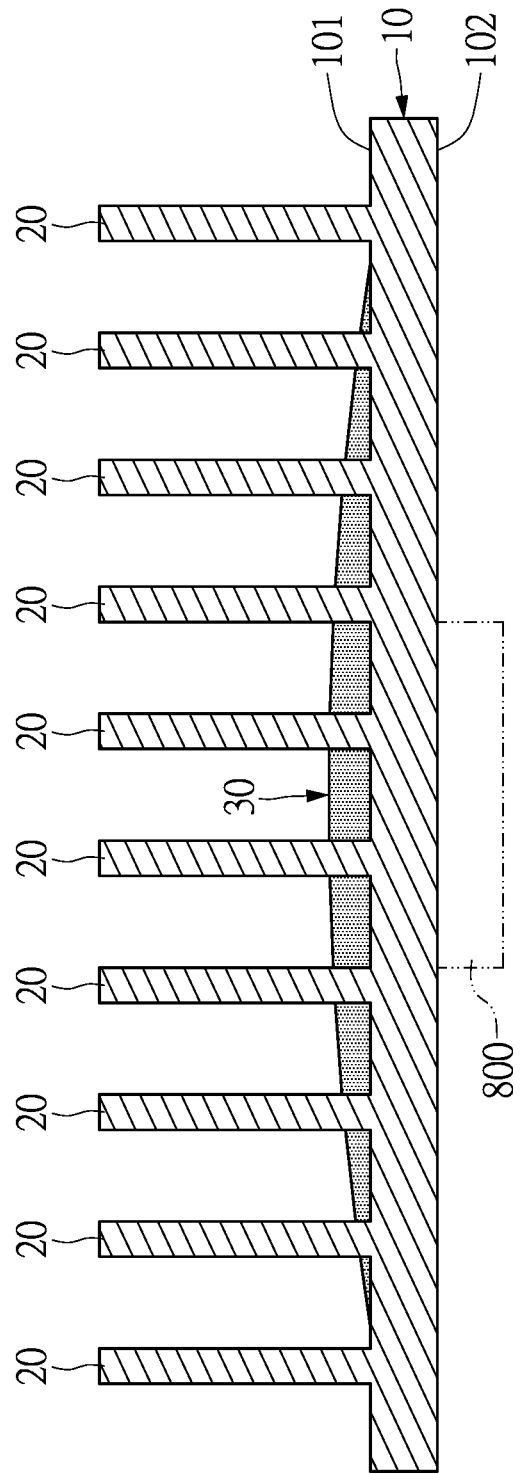
FIG. 7 is a schematic side view of a two-phase immersion-type heat dissipation structure according to a sixth embodiment of the present disclosure.

Referring to FIG. 7, a sixth embodiment of the present disclosure is substantially the same as the first embodiment, and the difference therebetween is described as follows.

In this embodiment, an average thickness of portions of the porous structure 30 that correspond in position to the heat source 800 is greater than an average thickness of portions of the porous structure 30 that do not correspond in position to the heat source 800, so as to increase an amount of bubbles generated on the portions of the porous structure 30 that correspond in position to the heat source 800, thereby improving an immersion-type heat dissipation effect.

Seventh Embodiment

Figure 8:
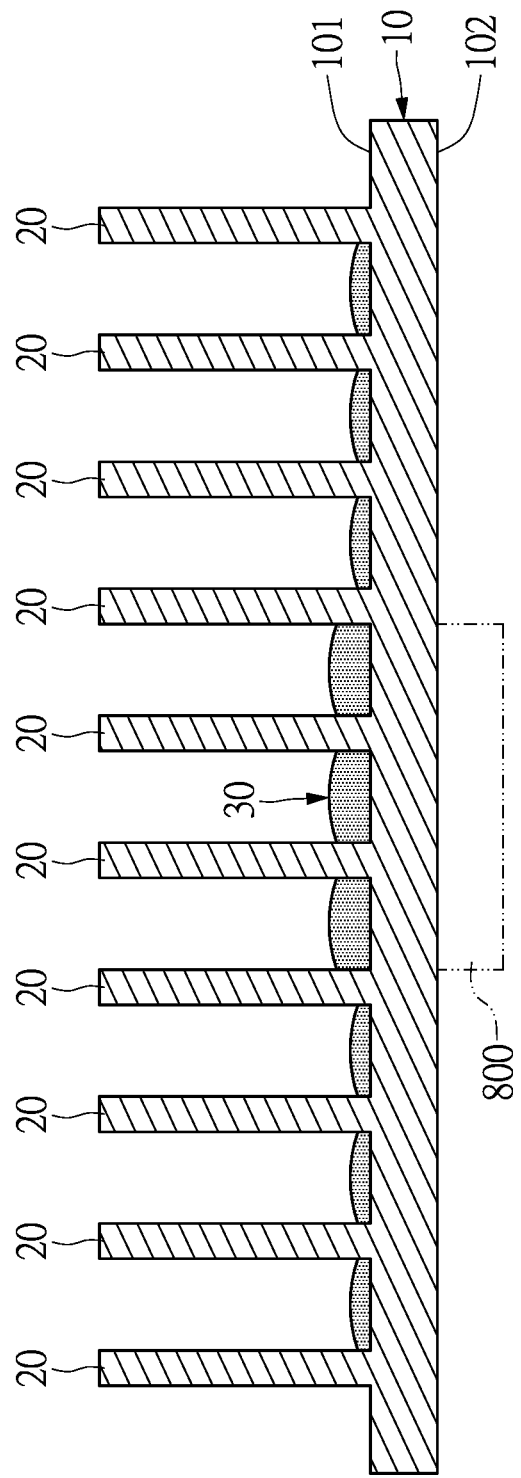
FIG. 8 is a schematic side view of a two-phase immersion-type heat dissipation structure according to a seventh embodiment of the present disclosure.

Referring to FIG. 8, a seventh embodiment of the present disclosure is substantially the same as the first embodiment and the sixth embodiment, and the difference therebetween is described as follows.

In this embodiment, an average thickness of portions of the porous structure 30 that correspond in position to a center between any two adjacent ones of the fins 20 is greater than an average thickness of portions of the porous structure 30 that are connected to peripheries of the two adjacent ones of the fins 20. That is, a convex structure is formed on the porous structure 30 and between any two adjacent ones of the fins 20. Compared to a flat structure and a concave structure, in this embodiment, the convex structure can facilitate the air bubbles generated thereon to leave a surface of the convex structure more rapidly, so as to further improve an immersion-type heat dissipation effect.

Eighth Embodiment

Figure 9:
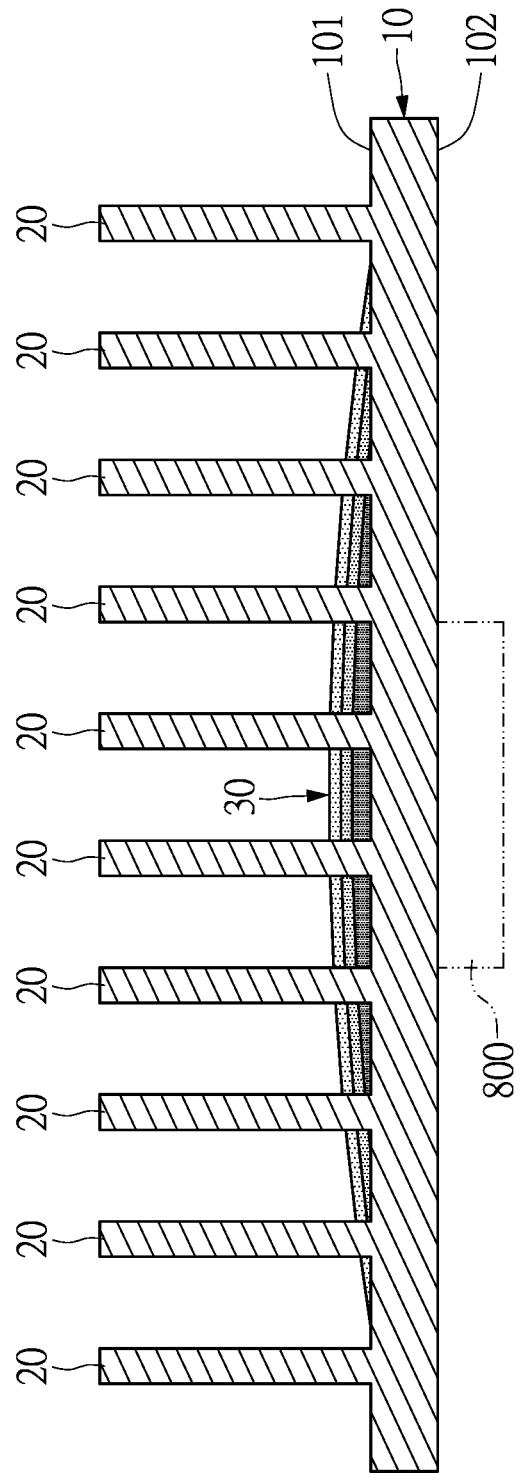
FIG. 9 is a schematic side view of a two-phase immersion-type heat dissipation structure according to an eighth embodiment of the present disclosure.

Referring to FIG. 9, an eighth embodiment of the present disclosure is substantially the same as the first embodiment and the sixth embodiment, and the difference therebetween is described as follows.

In this embodiment, the porous structure 30 can be a multi-layered compound structure formed by stacking of different materials.

Ninth Embodiment

Figure 10:
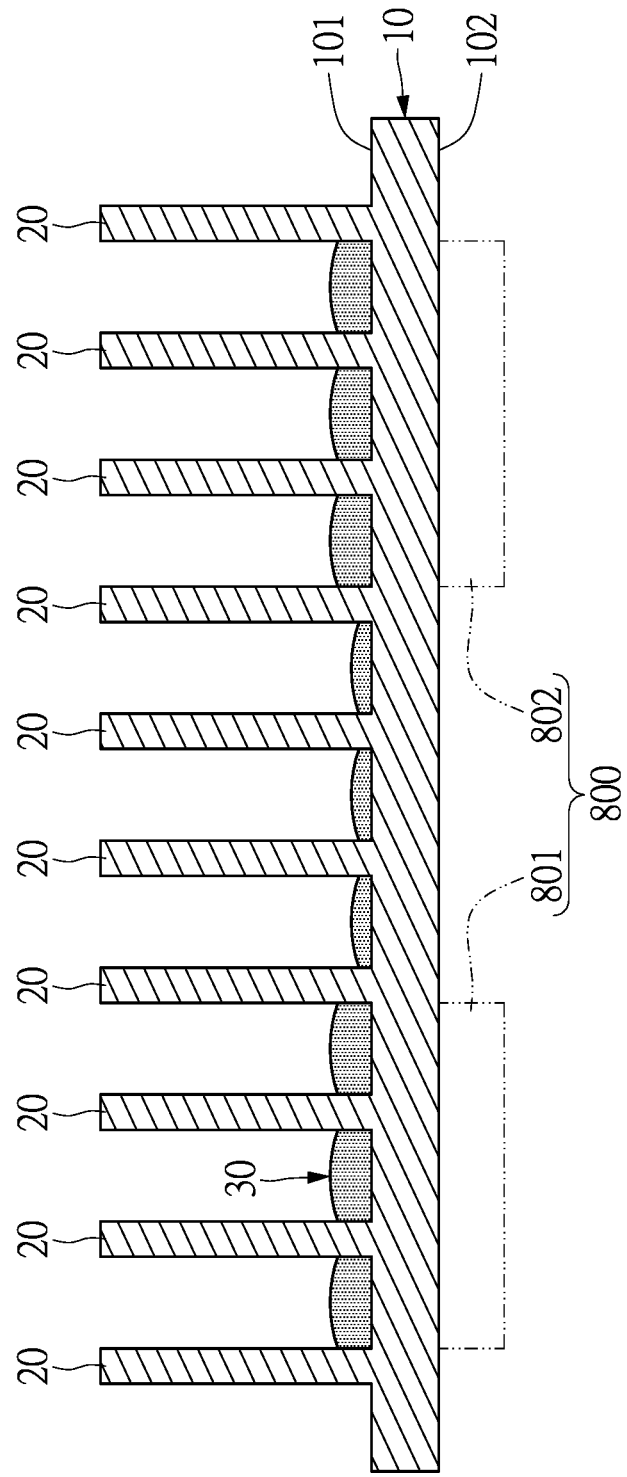
FIG. 10 is a schematic side view of a two-phase immersion-type heat dissipation structure according to a ninth embodiment of the present disclosure.

Referring to FIG. 10, a ninth embodiment of the present disclosure is substantially the same as the first embodiment and the seventh embodiment, and the difference therebetween is described as follows.

In this embodiment, the heat source 800 includes a first partial heat source 801 and a second partial heat source 802 that are spaced apart from each other; naturally, the heat source 800 can include a third partial heat source, a fourth partial heat source, and the like, and a quantity and a manner of arrangement of the partial heat sources are not limited thereto. An average thickness of portions of the porous structure that correspond in position to the first partial heat source 801 and the second partial heat source 802 is greater than an average thickness of portions of the porous structure that do not correspond in position to the first partial heat source 801 and the second partial heat source 802. That is, an average thickness of portions of the porous structure 30 that correspond in position to partial heat sources is greater than an average thickness of portions of the porous structure 30 that do not correspond in position to the partial heat sources.

Tenth Embodiment

Figure 11:
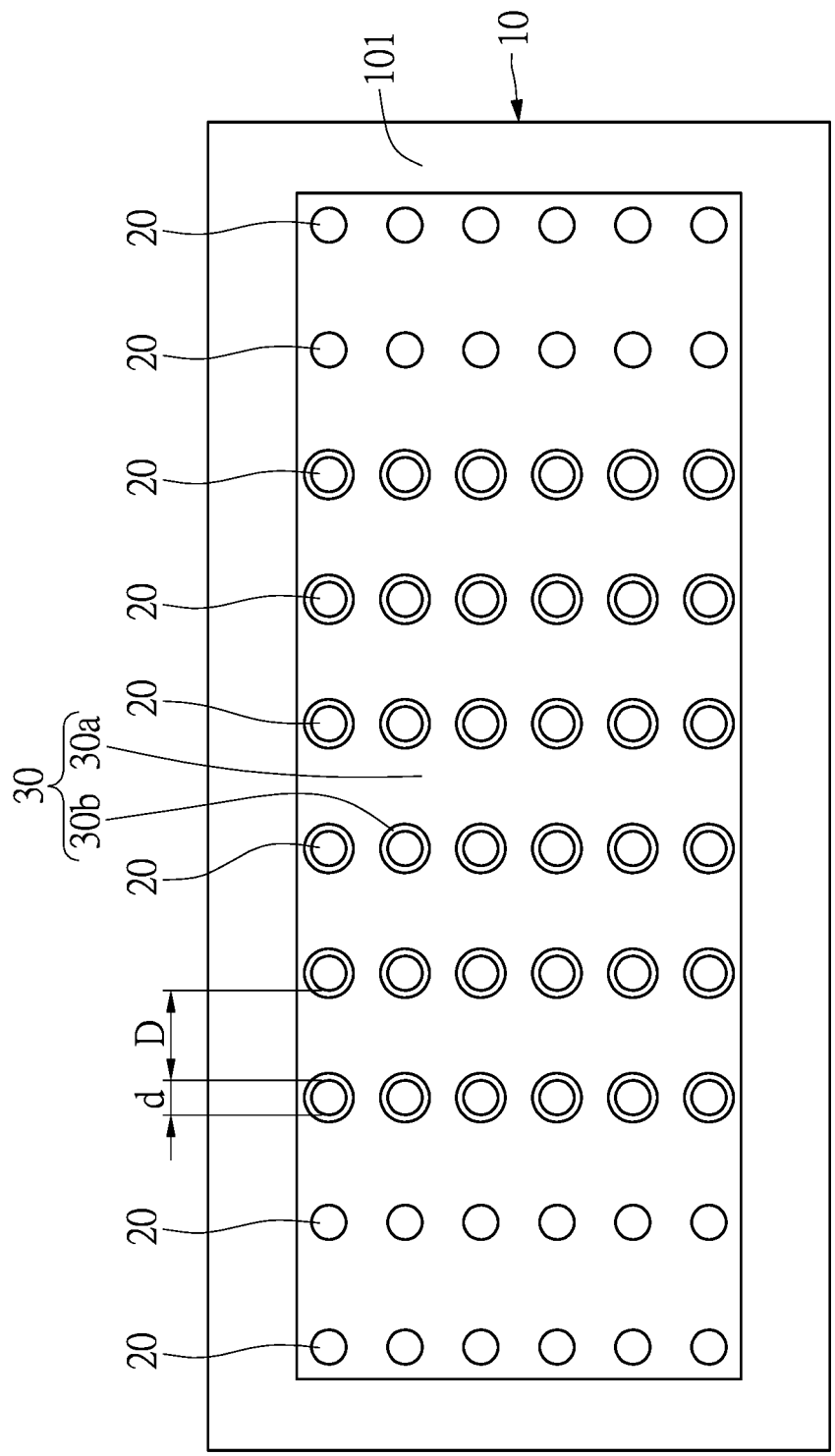
FIG. 11 is a schematic top view of a two-phase immersion-type heat dissipation structure according to a tenth embodiment of the present disclosure.

Referring to FIG. 11, a tenth embodiment of the present disclosure is substantially the same as the first embodiment, and the difference therebetween is described as follows.

In this embodiment, the plurality of fins 20 are pin-fins that are integrally formed on the fin surface 101 of the heat dissipation substrate 10. Furthermore, at least one of the fins 20 has a diameter d that is from 0.3 mm to 1 mm, and the diameter d indicates a diameter of a single fin 20. At least two adjacent ones of the fins 20 are spaced apart by a distance D that is from 0.3 mm to 0.6 mm, and the distance D indicates a shortest distance from one side surface of one of the fins 20 to an opposite side surface of an adjacent one of the fins 20. The one of the fins 20 has a height H that is from 3 mm to 7 mm, and the height H indicates a perpendicular distance from the fin surface 101 to a highest point of the one of the fins 20.

Beneficial Effects of the Embodiments

In conclusion, in the two-phase immersion-type heat dissipation structure having a porous structure, by technical features of "the two-phase immersion-type heat dissipation structure including a heat dissipation substrate, a plurality of fins, and a reinforcement frame," "the heat dissipation substrate having a fin surface and a non-fin surface that face away from each other, and the non-fin surface being configured to be in contact with a heat source immersed in a two-phase coolant," "a porous structure being covered onto at least one portion of the fin surface and at least one portion of the plurality of fins, and the porous structure having a porosity of from 10% to 50% and a thickness that is from 0.1 mm to 1 mm," and "the reinforcement frame being bonded to the heat dissipation substrate and surrounding another one portion of the plurality of fins," an overall immersion-type heat dissipation effect and a structural strength can be effectively improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-type heat dissipation structure, comprising:
    a heat dissipation substrate having a fin surface and a non-fin surface that face away from each other, wherein the non-fin surface is configured to be in contact with a heat source immersed in a two-phase coolant; and
    a plurality of fins, wherein the plurality of fins are skived fins that are integrally formed on the fin surface by skiving;
    wherein a porous structure is covered onto at least one portion of the fin surface and at least one portion of the plurality of fins, and the porous structure has a porosity of from 10% to 50% and a thickness that is from 0.1 mm to 1 mm, and wherein at least one of the fins has a thickness that is from 0.1 mm to 0.35 mm, a height that is from 5 mm to 10 mm, and at least two adjacent ones of the fins are spaced apart by a distance that is from 0.1 mm to 0.35 mm;
    wherein an average thickness of portions of the porous structure that correspond in position to the heat source is greater than an average thickness of portions of the porous structure that do not correspond in position to the heat source.

2. The two-phase immersion-type heat dissipation structure according to claim 1, wherein the fins are made of copper or copper alloy.

3. The two-phase immersion-type heat dissipation structure according to claim 1, wherein the porous structure is made of copper, copper alloy, silver, or silver alloy.

4. The two-phase immersion-type heat dissipation structure according to claim 1, wherein the porous structure is formed by sintering a metal powder.

5. The two-phase immersion-type heat dissipation structure according to claim 1, wherein the porous structure is formed by mixing a metal powder with a polymer material into a mixture and then sintering the mixture.

6. The two-phase immersion-type heat dissipation structure according to claim 1, wherein the porous structure is formed by first blending a metal powder into a metal powder paste or a metal powder solution and then sintering the metal powder paste or the metal powder solution.

7. The two-phase immersion-type heat dissipation structure according to claim 1, wherein the porous structure is formed by first blending a metal powder into a metal powder paste or a metal powder solution and then sintering the metal powder paste or the metal powder solution.

8. The two-phase immersion-type heat dissipation structure according to claim 1, wherein the porous structure is a multi-layered compound structure formed by stacking of different materials.

9. The two-phase immersion-type heat dissipation structure according to claim 1, wherein the porous structure is a copper mesh structure.

10. The two-phase immersion-type heat dissipation structure according to claim 1, wherein an average thickness of portions of the porous structure that correspond in position to a center between any two adjacent ones of the fins is greater than an average thickness of portions of the porous structure that are connected to peripheries of the two adjacent ones of the fins.

11. The two-phase immersion-type heat dissipation structure according to claim 1, wherein the heat source includes a plurality of partial heat sources, and wherein an average thickness of portions of the porous structure that correspond in position to the partial heat sources is greater than an average thickness of portions of the porous structure that do not correspond in position to the partial heat sources.

12. The two-phase immersion-type heat dissipation structure according to claim 1, wherein the porous structure is defined as a first porous structure that is covered onto the fin surface and second porous structures that are respectively covered onto peripheries of each of the fins, and wherein the first porous structure is made of a material or production manner that is different from a material or production manner by which the second porous structures are made.

13. The two-phase immersion-type heat dissipation structure according to claim 1, further comprising an reinforcement frame, wherein the reinforcement frame is bonded to the heat dissipation substrate and surrounds another one portion of the plurality of fins, and wherein the heat dissipation substrate or the reinforcement frame has a plurality of through holes formed thereon, and a plurality of spring screws correspondingly pass through the plurality of through holes.

14. The two-phase immersion-type heat dissipation structure according to claim 1, further comprising a highly thermally conductive structure, wherein the highly thermally conductive structure is bonded to the non-fin surface of the heat dissipation substrate, so that the heat dissipation substrate is in indirect contact with the heat source through the highly thermally conductive structure, and wherein the highly thermally conductive structure has an enclosed vacuum chamber formed therein, and the enclosed vacuum chamber contains liquid.

15. A two-phase immersion-type heat dissipation structure, comprising:
a heat dissipation substrate having a fin surface and a non-fin surface that face away from each other, wherein the non-fin surface is configured to be in contact with a heat source immersed in a two-phase coolant; and
a plurality of fins, wherein the plurality of fins are pin-fins that are integrally formed on the fin surface;
wherein a porous structure is covered onto at least one portion of the fin surface and at least one portion of the plurality of fins, and the porous structure has a porosity of from 10% to 50% and a thickness that is from 0.1 mm to 1 mm, and wherein at least one of the fins has a diameter that is from 0.3 mm to 1 mm, a height that is from 3 mm to 7 mm, and at least two adjacent ones of the fins are spaced apart by a distance that is from 0.3 mm to 0.6 mm;
wherein an average thickness of portions of the porous structure that correspond in position to the heat source is greater than an average thickness of portions of the porous structure that do not correspond in position to the heat source.

16. The two-phase immersion-type heat dissipation structure according to claim 15, wherein the fins are made of copper or copper alloy.

17. The two-phase immersion-type heat dissipation structure according to claim 15, wherein the porous structure is made of copper, copper alloy, silver, or silver alloy.

18. The two-phase immersion-type heat dissipation structure according to claim 15, wherein the porous structure is formed by sintering a metal powder.

19. The two-phase immersion-type heat dissipation structure according to claim 15, wherein the porous structure is formed by mixing a metal powder with a polymer material into a mixture and then sintering the mixture.

20. The two-phase immersion-type heat dissipation structure according to claim 15, wherein the porous structure is formed by first blending a metal powder into a metal powder paste or a metal powder solution and then sintering the metal powder paste or the metal powder solution.

21. The two-phase immersion-type heat dissipation structure according to claim 15, wherein the porous structure is formed by first blending a metal powder into a metal powder paste or a metal powder solution and then sintering the metal powder paste or the metal powder solution.

22. The two-phase immersion-type heat dissipation structure according to claim 15, wherein the porous structure is a multi-layered compound structure formed by stacking of different materials.

23. The two-phase immersion-type heat dissipation structure according to claim 15, wherein the porous structure is a copper mesh structure.

24. The two-phase immersion-type heat dissipation structure according to claim 15, wherein an average thickness of portions of the porous structure that correspond in position to a center between any two adjacent ones of the fins is greater than an average thickness of portions of the porous structure that are connected to peripheries of the two adjacent ones of the fins.

25. The two-phase immersion-type heat dissipation structure according to claim 15, wherein the heat source includes a plurality of partial heat sources, and wherein an average thickness of portions of the porous structure that correspond in position to the partial heat sources is greater than an average thickness of portions of the porous structure that do not correspond in position to the partial heat sources.

26. The two-phase immersion-type heat dissipation structure according to claim 15, wherein the porous structure is defined as a first porous structure that is covered onto the fin surface and second porous structures that are respectively covered onto peripheries of each of the fins, and wherein the first porous structure is made of a material or production manner that is different from a material or production manner by which the second porous structures are made.

27. The two-phase immersion-type heat dissipation structure according to claim 15, further comprising an reinforcement frame, wherein the reinforcement frame is bonded to the heat dissipation substrate and surrounds another one portion of the plurality of fins, and wherein the heat dissipation substrate or the reinforcement frame has a plurality of through holes formed thereon, and a plurality of spring screws correspondingly pass through the plurality of through holes.

28. The two-phase immersion-type heat dissipation structure according to claim 15, further comprising a highly thermally conductive structure, wherein the highly thermally conductive structure is bonded to the non-fin surface of the heat dissipation substrate, so that the heat dissipation substrate is in indirect contact with the heat source through the highly thermally conductive structure, and wherein the highly thermally conductive structure has an enclosed vacuum chamber formed therein, and the enclosed vacuum chamber contains liquid.

* * * * *